(12) United States Patent
Ichihara et al.

(10) Patent No.: US 10,002,997 B2
(45) Date of Patent: Jun. 19, 2018

(54) LEAD FRAME FOR LIGHT EMITTING DEVICE, AND LEAD FRAME MEMBER FOR LIGHT EMITTING DEVICE

(71) Applicant: NICHIA CORPORATION, Anan-shi, Tokushima (JP)

(72) Inventors: Yoshio Ichihara, Anan (JP); Takeo Kurimoto, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days. days.

(21) Appl. No.: 15/487,578

(22) Filed: Apr. 14, 2017

(65) Prior Publication Data

US 2017/0222110 A1    Aug. 3, 2017

Related U.S. Application Data

(63) Continuation of application No. 14/721,218, filed on May 26, 2015, now Pat. No. 9,666,777.

(30) Foreign Application Priority Data

May 29, 2014  (JP) ................................. 2014-111074
Oct. 3, 2014   (JP) ................................. 2014-204848

(51) Int. Cl.
| H01L 33/00 | (2010.01) |
| H01L 33/62 | (2010.01) |
| H01L 25/075 | (2006.01) |
| H01L 33/48 | (2010.01) |
| H01L 33/56 | (2010.01) |

(52) U.S. Cl.
CPC .......... *H01L 33/62* (2013.01); *H01L 25/0753* (2013.01); *H01L 33/486* (2013.01); *H01L 33/56* (2013.01)

(58) Field of Classification Search
CPC ........ H01L 33/62; H01L 33/56; H01L 33/486
See application file for complete search history.

(56) References Cited

U.S. PATENT DOCUMENTS

| 2011/0031865 A1 | 2/2011 | Hussell et al. |
| 2011/0186875 A1 | 8/2011 | Egoshi et al. |
(Continued)

FOREIGN PATENT DOCUMENTS

| JP | 3128427 U | 1/2007 |
| JP | 2008-153610 A | 7/2008 |
(Continued)

*Primary Examiner* — William Harriston

(57) ABSTRACT

A lead frame for a light emitting device includes a plurality of unit regions and a plurality of suspension pins. Each of the unit regions each includes first to third leads. The suspension pins defines substantially rectangular frames each surrounding a corresponding one of the unit regions. The suspension pins link adjacent ones of the unit regions. In each of the unit regions, the first lead is disposed near a first corner of the substantially rectangular frame and linked to the substantially rectangular frame only via a first extension, the second lead is disposed near a second corner of the substantially rectangular frame and linked to the substantially rectangular frame only via a second extension, and the third lead includes at least two third extensions respectively linked to opposing sides of the substantially rectangular frame.

16 Claims, 12 Drawing Sheets

(56) References Cited

U.S. PATENT DOCUMENTS

| | | |
|---|---|---|
| 2011/0316022 A1 | 12/2011 | Hussell |
| 2013/0221509 A1 | 8/2013 | Oda et al. |
| 2014/0349424 A1 | 11/2014 | Oda et al. |
| 2015/0084177 A1 | 3/2015 | Oda et al. |
| 2016/0218051 A1* | 7/2016 | Doumae ........... H01L 23/49541 |

FOREIGN PATENT DOCUMENTS

| | | |
|---|---|---|
| JP | 2012-089547 A | 10/2010 |
| JP | 2011-176264 A | 9/2011 |
| JP | 2012-084724 A | 4/2012 |
| JP | 2012-182180 A | 9/2012 |
| JP | 2013-140892 A | 7/2013 |
| JP | 2013-235872 A | 11/2013 |
| JP | 2014-146763 A | 8/2014 |
| WO | 2012-060336 A1 | 5/2012 |

* cited by examiner

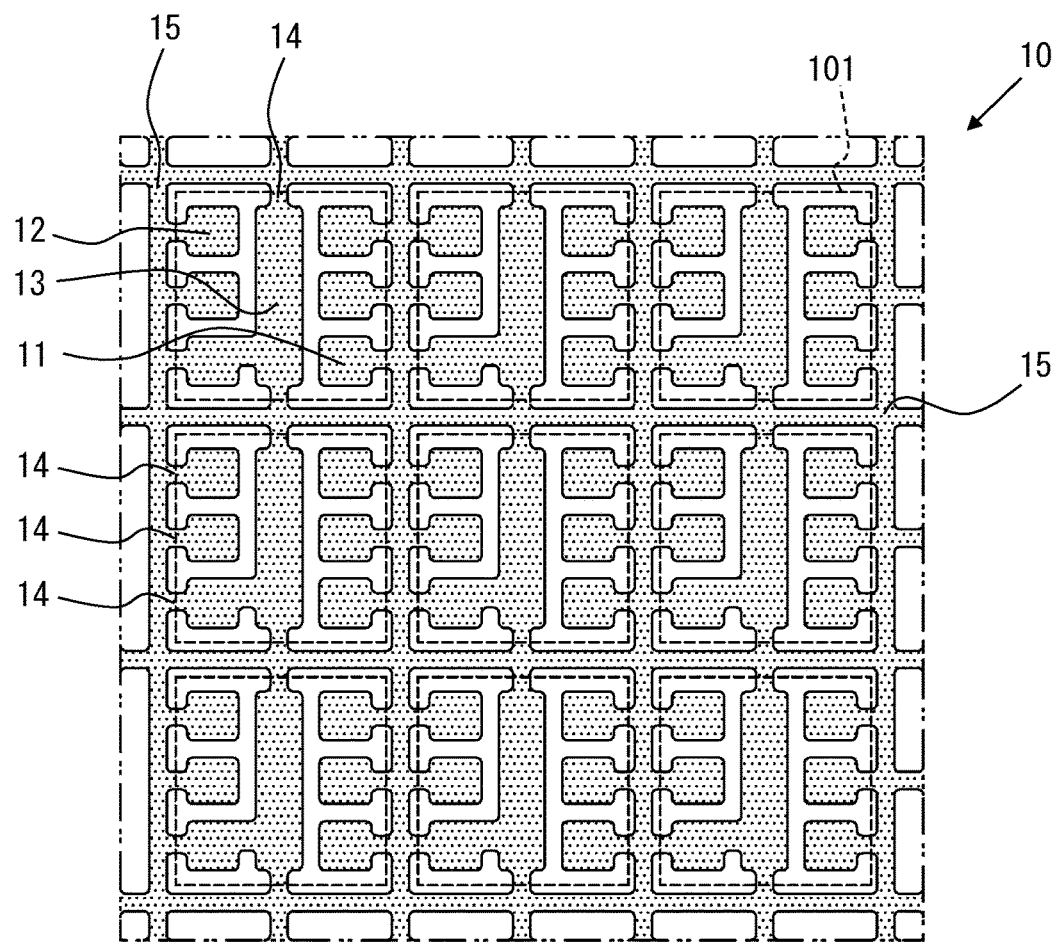
F I G. 1

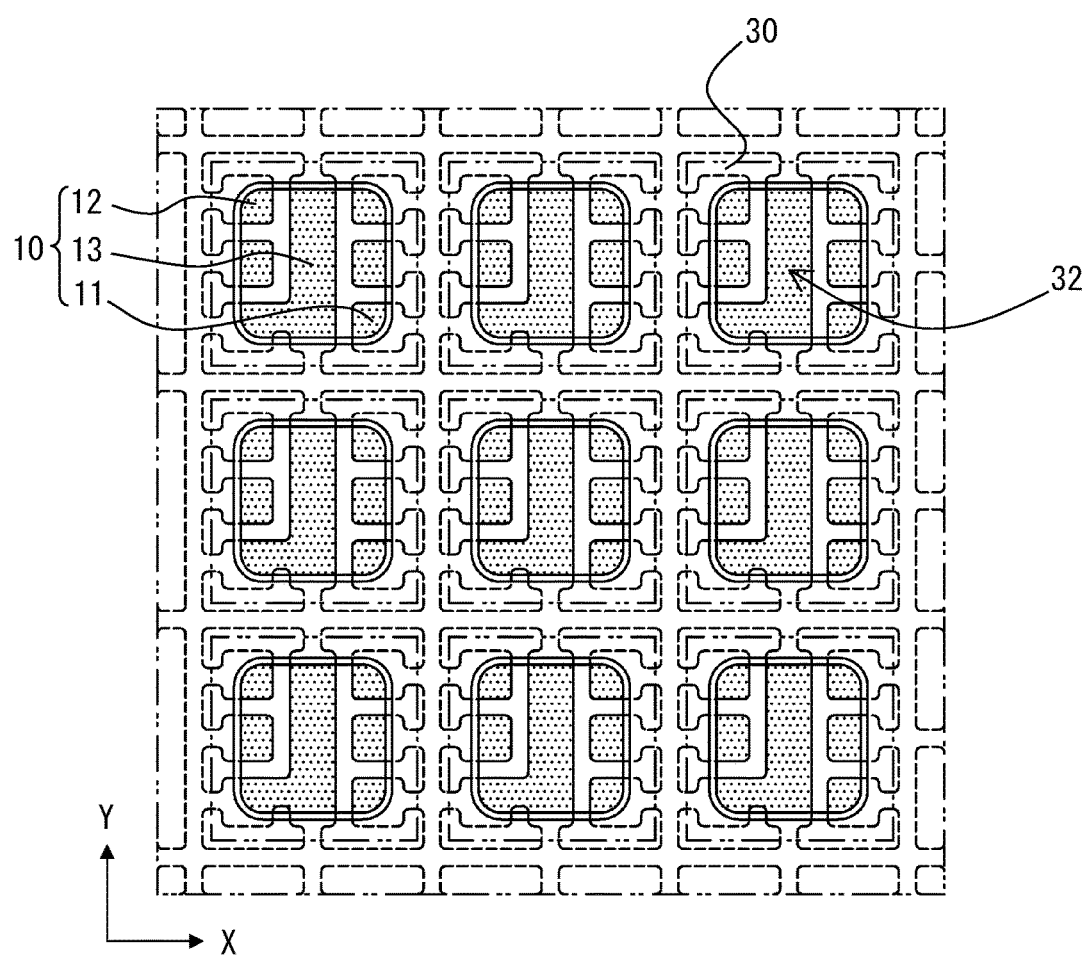
F I G. 2

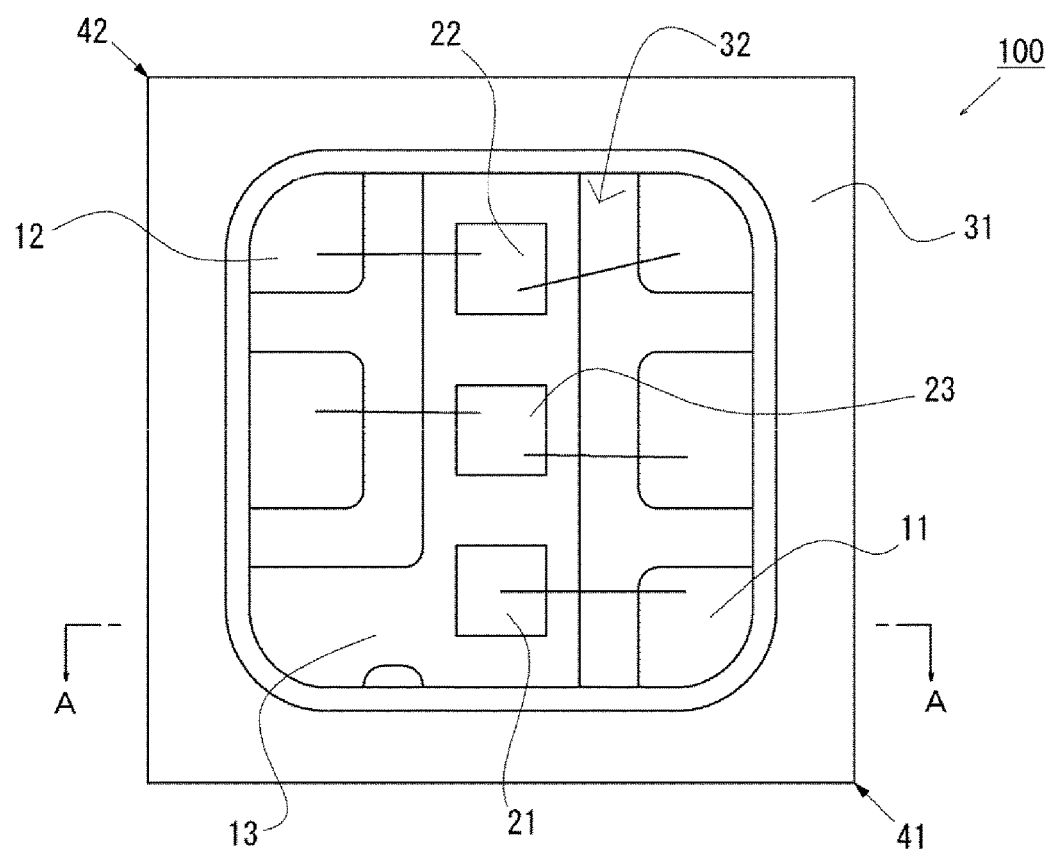
F I G. 4A

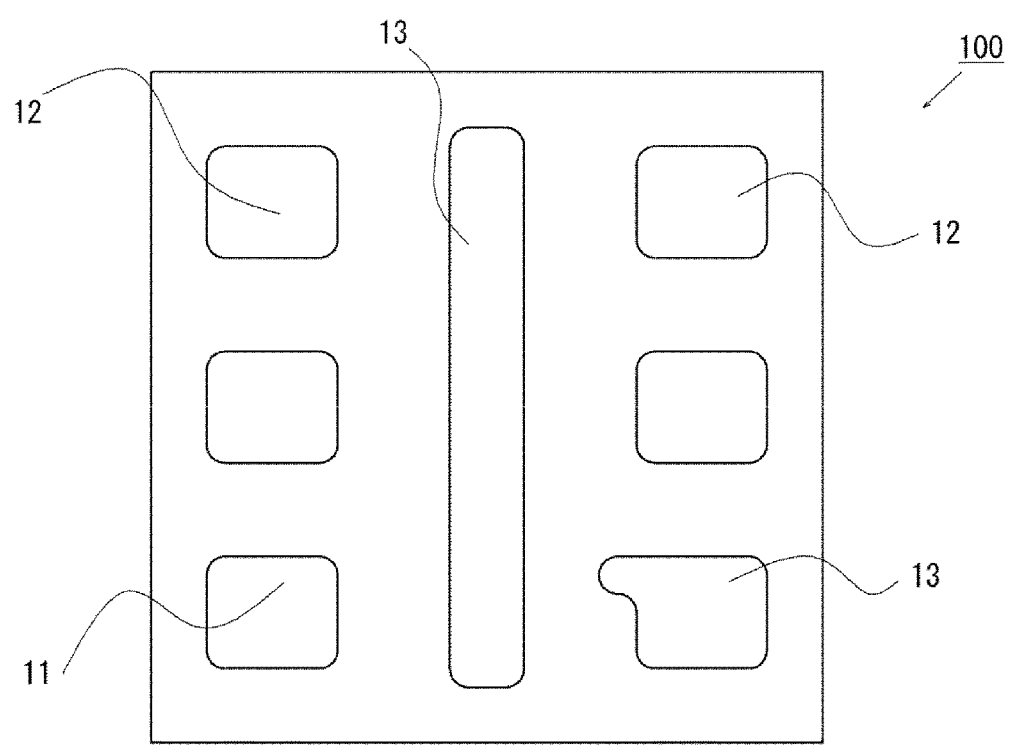
F I G. 4B

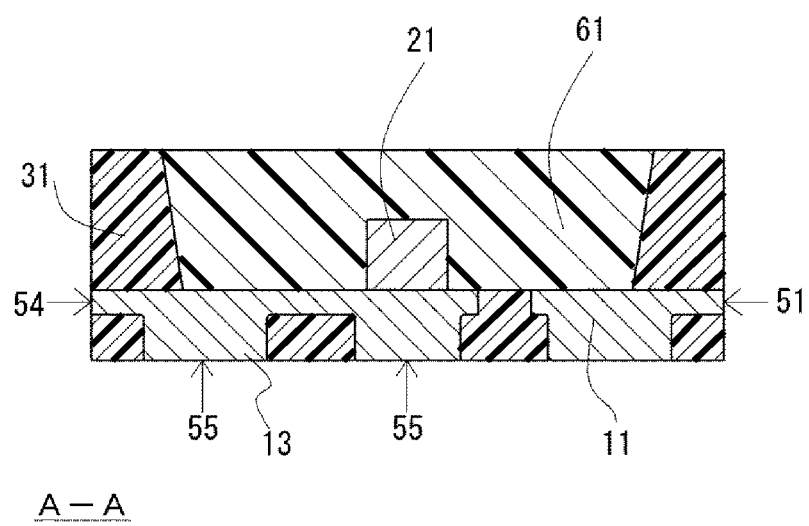
F I G. 5

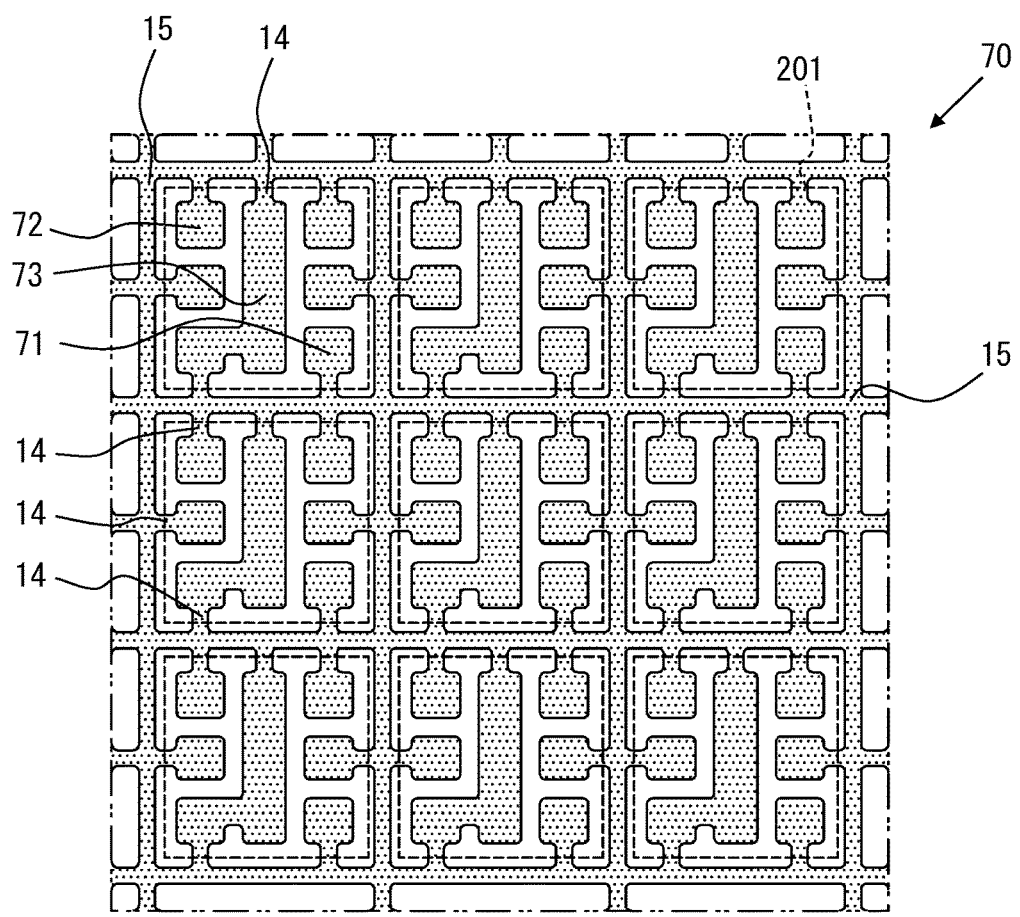
F I G. 6

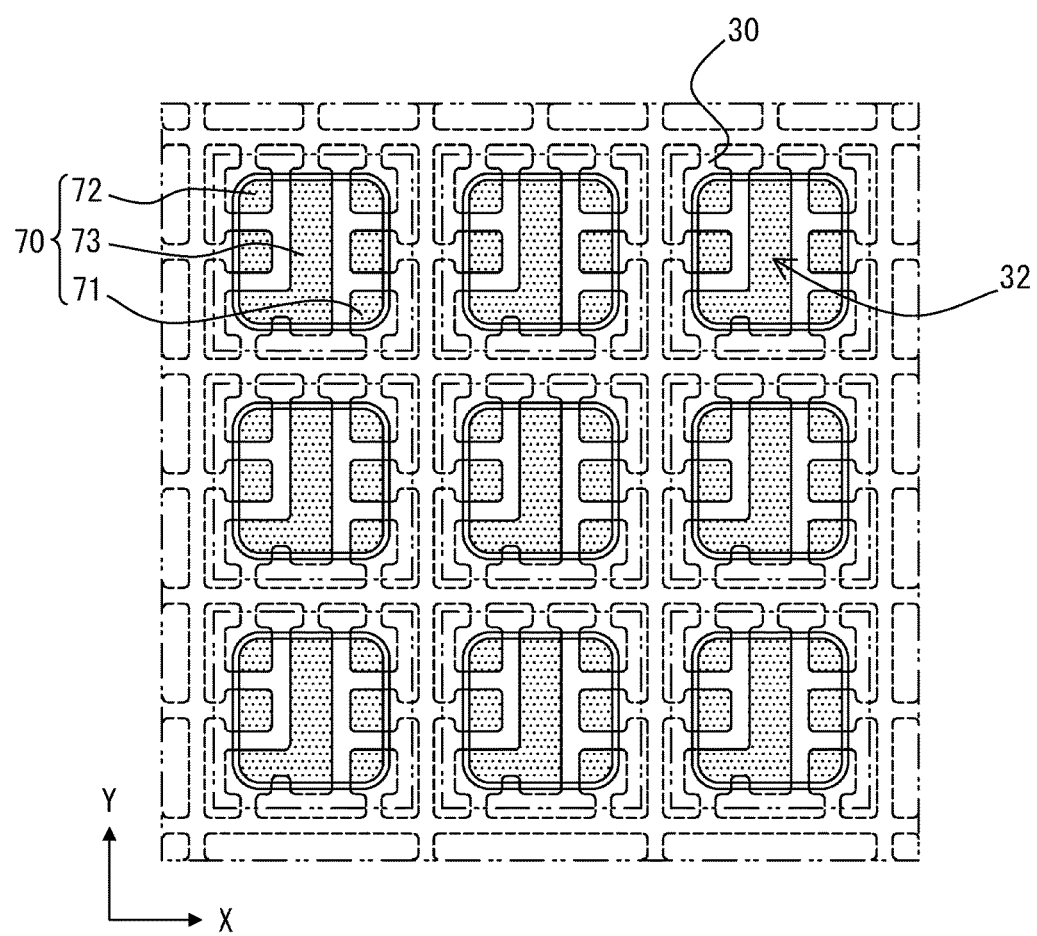
F I G. 7

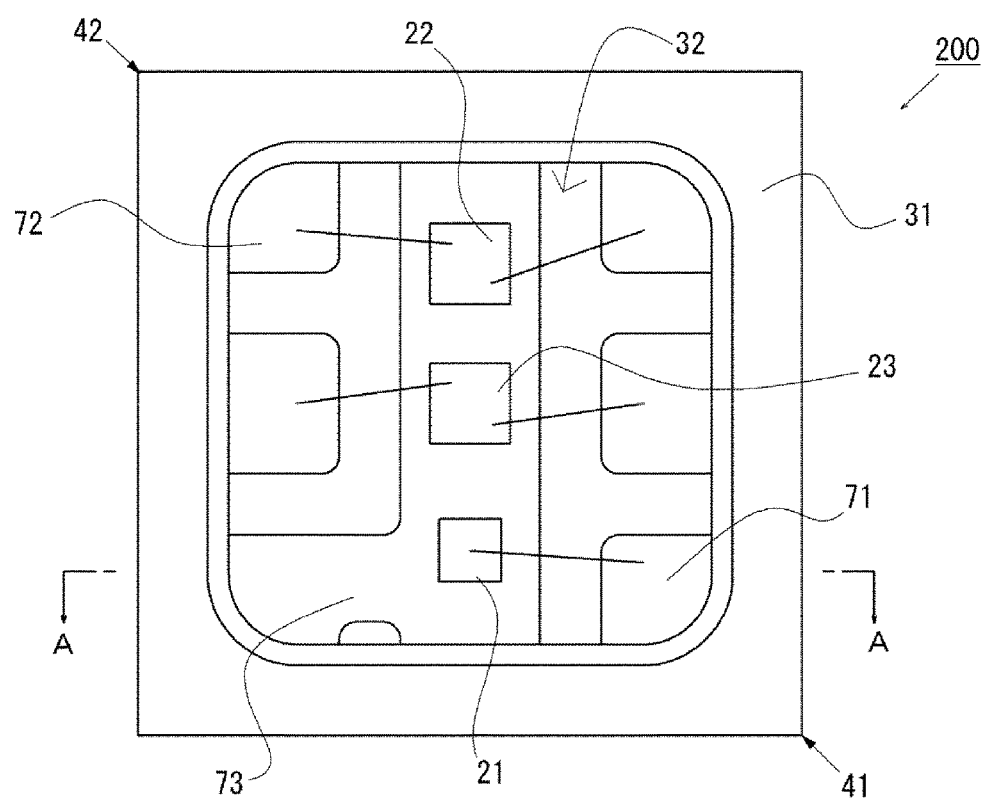
F I G. 9A

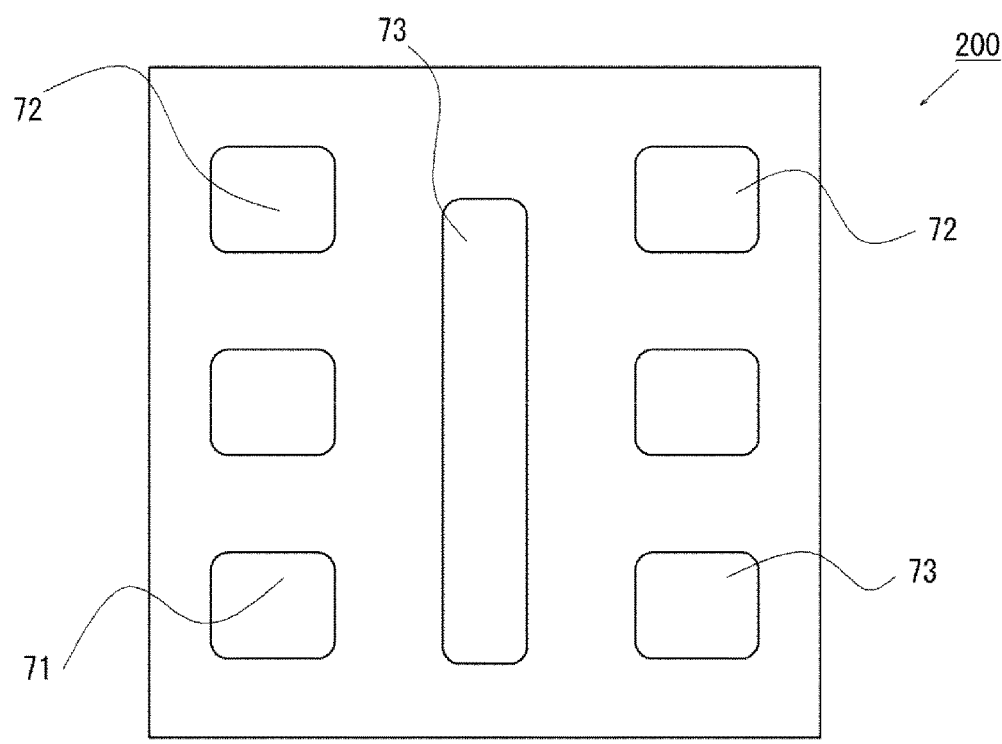
F I G. 9B

LEAD FRAME FOR LIGHT EMITTING DEVICE, AND LEAD FRAME MEMBER FOR LIGHT EMITTING DEVICE

CROSS-REFERENCE TO RELATED APPLICATIONS

This application is a continuation application of U.S. patent application Ser. No. 14/721,218, filed on May 26, 2015. This application claims priority to Japanese Patent Application No. 2014-111074 filed on May 29, 2014 and Japanese Patent Application No. 2014-204848 filed on Oct. 3, 2014. The entire disclosures of U.S. patent application Ser. No. 14/721,218, Japanese Patent Application Nos. 2014-111074 and 2014-204848 are hereby incorporated herein by reference.

BACKGROUND

Technical Field

The present disclosure relates to a lead frame for a light emitting device and a lead frame member for a light emitting device.

Related Art

For example, a light emitting device featuring an LED is produced by mounting the LED in a resin molding in which positive and negative leads have been embedded, and covering the LED with a translucent resin. With this light emitting device, a lead frame in which positive and negative leads are formed is put in a mold, resin is injected into the cavity, which is formed corresponding to individual light emitting devices, and the resin is cured, after which the individual light emitting devices are separated. The lead frame used in the manufacture of this light emitting device has unit regions, each including positive and negative leads, arranged in a pattern in order to mold a plurality of light emitting devices all at once. In this specification, these unit regions are called regions corresponding to individual light emitting devices. Also, in this specification, a flat member on which a plurality of unit regions are arranged in a pattern is called a lead frame or a linked lead frame.

The lead frame needs to support a plurality of leads in an aggregated state over a plurality of unit regions, so the leads are linked between adjacent unit regions, and these linked parts are cut after molding. Many different lead frame structures have been proposed in the past, and JP2012-89547A discloses a lead frame in which leads are linked between adjacent unit regions.

Also, JP2011-176264A discloses a lead frame comprising six leads per unit region, in which the six leads are linked to linked parts in which the six leads surround the unit region.

SUMMARY OF THE INVENTION

However, a problem encountered with a resin molding produced using a conventional lead frame can be that cracks are developed in the resin molding when the linked parts are cut.

A lead frame for a light emitting device according to one embodiment includes a plurality of unit regions and a plurality of suspension pins. Each of the unit regions each includes first to third leads. The suspension pins defines substantially rectangular frames each surrounding a corresponding one of the unit regions. The suspension pins link adjacent ones of the unit regions. In each of the unit regions, the first lead is disposed near a first corner of a corresponding one of the substantially rectangular frames and linked to the corresponding one of the substantially rectangular frames only via a first extension, the second lead is disposed near a second corner of the corresponding one of the substantially rectangular frames and linked to the corresponding one of the substantially rectangular frames only via a second extension, and the third lead includes at least two third extensions respectively linked to opposing sides of the corresponding one of the substantially rectangular frames.

The lead frame for a light emitting device according to the present disclosure can reduce cracking and splitting of the resin molding, and allows high reliability of the light emitting device of to be obtained.

BRIEF DESCRIPTION OF DRAWINGS

FIG. 1 is a top view of a lead frame constituting a light emitting device pertaining to a first embodiment of the present invention;

FIG. 2 is a top view of a lead frame including a resin molding molded integrally with the lead frame in FIG. 1;

FIG. 4A is a simplified top view illustrating the light emitting device pertaining to the first embodiment of the present invention;

FIG. 4B is a simplified bottom view illustrating the light emitting device pertaining to the first embodiment of the present invention;

FIG. 5 is a simplified cross section along the A-A line of the light emitting device in FIG. 4A;

FIG. 6 is a top view of a lead frame constituting a light emitting device pertaining to a second embodiment of the present invention;

FIG. 7 is a top view of a lead frame including a resin molding molded integrally with the lead frame in FIG. 6;

FIG. 9A is a simplified top view illustrating the light emitting device pertaining to the second embodiment of the present invention;

FIG. 9B is a simplified bottom view illustrating the light emitting device pertaining to the second embodiment of the present invention.

DETAILED DESCRIPTION OF THE INVENTION

Embodiment 1

Light Emitting Device 100

Figure 3:
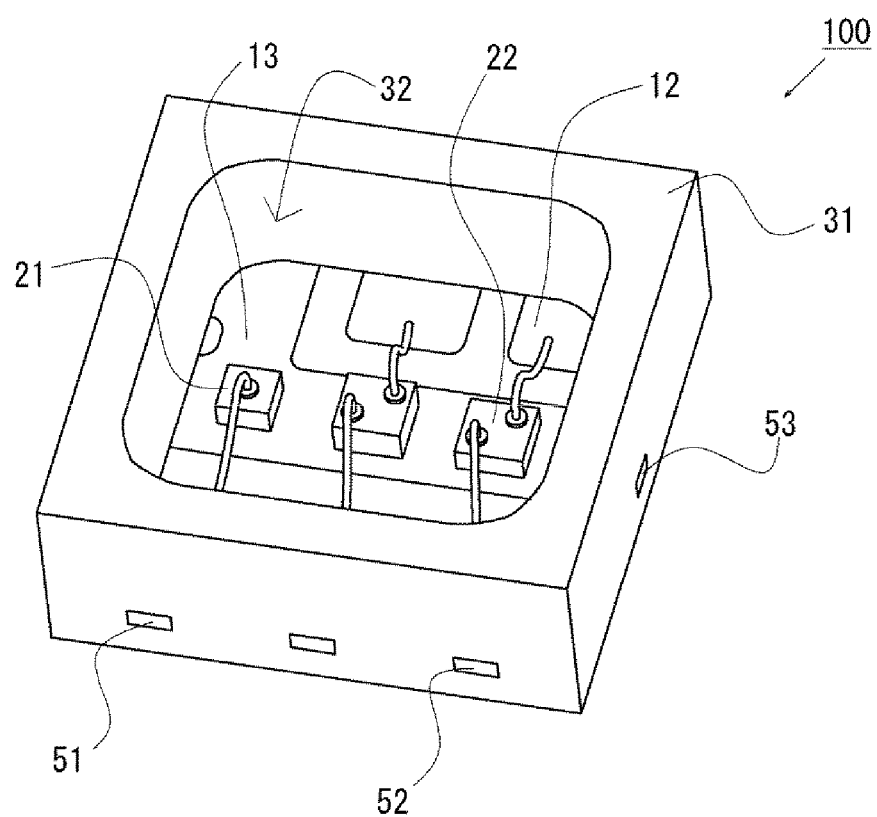
FIG. 3 is a simplified oblique view illustrating the light emitting device pertaining to the first embodiment of the present invention.
Figure 8:
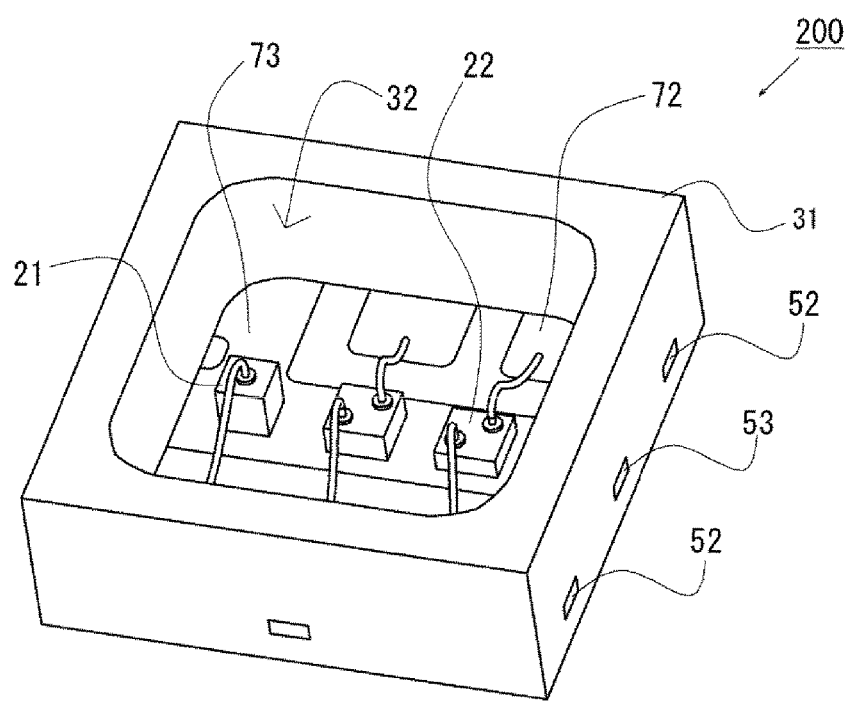
FIG. 8 is a simplified oblique view illustrating the light emitting device pertaining to the second embodiment of the present invention.
Figure 10:
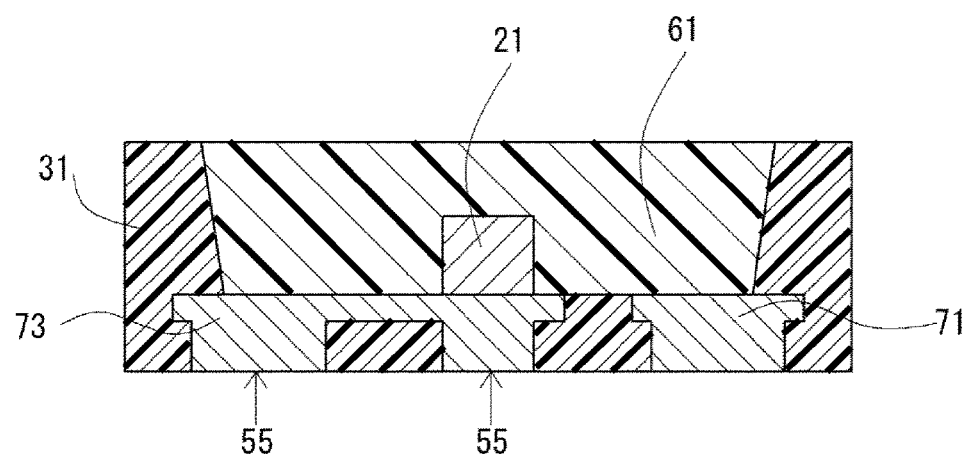
FIG. 10 is a simplified cross section along the A-A line of the light emitting device in FIG. 9A.

As shown in FIG. 3, a light emitting device 100 includes a first light emitting element 21, a second light emitting element 22, a plurality of leads for individually driving the first light emitting element 21 and the second light emitting element 22, and a resin molding 31 that is molded integrally with the plurality of leads and is substantially rectangular in top view. The leads provided to the light emitting device 100 include a first lead 11 that is connected by wire to the first light emitting element 21, a second lead 12 that is connected by wire to the second light emitting element 22, and a third lead 13 on which the first light emitting element 21 and the second light emitting element 22 are mounted. The first lead 11 is disposed near a first corner of the resin molding 31 in top view, has a first exposed part 51 that is exposed from one of the two side surfaces that share the first corner, and is embedded in the resin molding 31 on the other side surface side. The second lead 12 is disposed near a second corner of the resin molding 31 in top view, has a second exposed part 52 that is exposed from one of the two side surfaces that share the second corner, and is embedded in the resin molding 31 on the other side surface side.

With this configuration, there is a particular improvement in resistance to stress applied near the exposed part of leads on the side surfaces of the resin molding during dicing, which reduces cracking, splitting, and separation in the resin molding, and allows a more reliable light emitting device to be obtained.

Light Emitting Elements

The light emitting elements are usually semiconductor light emitting elements, and any type of element known as a light emitting diode element may be used. Two or more light emitting elements are mounted, and the two or more light emitting elements are individually driven. The two or more light emitting elements may be light emitting elements that emit the same color, or may be light emitting elements that emit different colors.

As shown in FIG. 4A, the first light emitting element 21 and the second light emitting element 22 are mounted in the light emitting device 100. The first light emitting element 21 and the second light emitting element 22 can be light emitting elements that emit different color lights. In this embodiment, a third light emitting element 23 is formed mounted in addition to the first light emitting element 21 and the second light emitting element 22, and the first light emitting element 21, the third light emitting element 23, and the second light emitting element 22 are mounted in a row in that order on the third lead 13. Light emitting elements with different emission wavelengths can be selected for the first light emitting element 21, the second light emitting element 22, and the third light emitting element 23. In particular, in a light emitting device used for a full-color display device, it is preferable to combine three kinds of light emitting element that emit red, green, and blue light, as this enhances color reproducibility. The light emitting elements are preferably arranged in a single row in a specific direction. When three types of light emitting element (red, green, and blue) are combined, they are preferably arranged in a row so that the green light emitting element, which has the highest brightness, is disposed near the center of the light emitting device, which color mixing of the light emitted from the light emitting elements.

The wavelengths of the light emitting elements can be selected in accordance with the intended application. For instance, ZnSe, a nitride semiconductor ($In_XAl_YGa_{1-X-Y}N$, $0 \leq X$, $0 \leq Y$, $X+Y \leq 1$), GaP, or another such semiconductor layer may be used as a blue (light with a wavelength of 430 to 490 nm) or green (light with a wavelength of 490 to 570 nm) light emitting element, and GaAlAs, AlInGaP, or another such semiconductor layer may be used as a red (light with a wavelength of 620 to 750 nm) light emitting element. In addition to light emitting elements that emit visible light in intermediate colors of these, it is also possible to use an infrared light emitting element, an ultraviolet light emitting element, or the like.

The light emitting elements are usually formed by forming a semiconductor layer over a growth substrate (such as a sapphire substrate). The substrate may have unevennes on its surface that is joined to the semiconductor layer. This allows the critical angle when the light emitted from the semiconductor layer radiates the substrate to be intentionally varied, making it easier to extract the light to the outside of the substrate.

The light emitting elements may have a pair of positive and negative electrodes on the same side with respect to the active layer, or may have a pair of positive and negative electrodes on different sides with respect to the active layer.

As shown in FIG. 4A, the first light emitting element 21 and the second light emitting element 22 are mounted on the third lead 13. The first light emitting element 21 is connected by wire to the first lead 11, and the second light emitting element 22 is connected by wire to the second lead 12. The first light emitting element 21 and the second light emitting element 22 can be individually driven. The light emitting device 100 further includes the third light emitting element 23. The third light emitting element 23 is preferably mounted on the third lead 13, as are the first light emitting element 21 and the second light emitting element 22. In this case, the light emitting device 100 preferably further includes a pair of positive and negative leads with which the third light emitting element 23 can be independently driven.

The light emitting elements are usually mounted on leads, and a bonding member is used for that purpose. For example, with light emitting elements having blue and green light emission and formed by growing a nitride semiconductor layer on a sapphire substrate, an epoxy resin, silicone, or the like can be used as the bonding member. When deterioration by heat or light from the light emitting elements is taken into account, the back surfaces of the light emitting elements may be plated with aluminum, or no resin may be used, and an Au—Sn eutectic solder or other such solder, or a low-melting point metal or other such braze may be used as the bonding member. When a light emitting element in which electrodes are formed on both sides, such as a light emitting element having red light emission and made of GaAs or the like, die-bonding may be performed with silver, gold, palladium, or another such conductive paste or the like.

Further, a protective element may be mounted in the light emitting device. There may be just one protective element, or there may be two or more. There are no particular restrictions on the protective element here, and any conventional type that is mounted in light emitting devices may be used. More specifically, examples include anti-static protective elements and protective circuits against overheating, over-voltage, and over-current. The location where the protective element is mounted may be near the light emitting elements, but all or part of the protective element may be embedded in the resin molding.

Resin Molding

As shown in FIG. 4A, the resin molding 31 is substantially rectangular in top view. In other words, the resin molding 31 has an upper surface (a light emission surface), a lower surface opposite from the upper surface, and four side surfaces extending between the light emission surface and the lower surface such that the four side surfaces define a substantially rectangular shape when viewed along a direction normal to the lower surface of the resin molding 31. Furthermore, the resin molding 31 is formed along with a plurality of leads, and an opening or a recess 32 that houses the light emitting elements is formed. More specifically, the bottom surface of the recess 32 mainly composes of the upper surfaces of the plurality of leads (including the first, second, and third leads 11, 12, and 13), and the surface of the resin molding 31 in which the isolation regions of these leads are embedded. In this embodiment, the bottom surface of the recess is substantially flat, but protrusions may be provided in the isolation regions, for example. These protrusions preferably widen getting closer to the bottom surface of the recess, in order for the light emitted by the light emitting elements to be extracted more efficiently. Also, these protrusions may be formed integrally with the resin molding 31, or may be provided separately from the resin molding 31. The side wall surfaces of the recess are constituted by the surface of the resin molding 31. The side wall surfaces of the recess may be perpendicular to the bottom surface of the recess, but they are preferably sloped so that the opening narrows toward the bottom surface of the recess, in order for the light emitted by the light emitting elements to be extracted more efficiently. When the first light emitting element and second light emitting element are light emitting elements with different emission colors, the inclination angle of the recess side wall surfaces on the first light emitting element side and the second light emitting element side may be given different inclination angles with respect to the recess bottom surface in order to reduce variation in the distribution of emission color. The recess, that is, the recess side walls, can be also omitted, and the resin molding may instead be formed in a flat plate shape, for example.

Examples of base materials of the resin molding include a thermoplastic resin such as an aliphatic polyamide resin, a semi-aromatic polyamide resin, a polyethylene terephthalate, a polycyclohexane terephthalate, a liquid crystal polymer, a polycarbonate resin, a syndiotactic polystyrene, a polyphenylene ether, a polyphenylene sulfide, a polyether sulfone resin, a polyether ketone resin, a polyarylate resin, and a thermosetting resin such as an epoxy resin; a modified epoxy resin, ; a silicone resin, a modified silicone resin, a silicone modified epoxy resin; an epoxy modified silicone resin; a polybismaleimide triadine resin, a polyimide resin, polyurethane resin. Particles and fibers such as glass, silica, titanium oxide, magnesium oxide, magnesium carbonate, magnesium hydroxide, calcium carbonate, calcium hydroxide, calcium silicate, magnesium silicate, wollastonite, mica, zinc oxide, barium titanate, potassium titanate, aluminum borate, aluminum oxide, zinc oxide, silicon carbide, antimony oxide, zinc stannate, zinc borate, iron oxide, chromium oxide, manganese oxide, carbon black can be included in the base material as a filler or a coloring pigment.

The thermosetting resin is resistant to chemical and thermal effects, but after curing, it is usually harder than a thermoplastic resin, and is therefore more susceptible to cracking and splitting. Therefore, the configuration of this embodiment of the present invention will be particularly effective when such a resin is used. An epoxy resin or a modified epoxy resin is particularly preferable.

Lead Frame

The light emitting device 100 includes a plurality of leads for individually driving the first light emitting element 21 and the second light emitting element 22. More specifically, it includes the first lead 11 that is connected by wire to the first light emitting element 21, the second lead 12 that is connected by wire to the second light emitting element 22, and the third lead 13 on which the first light emitting element and second light emitting element are mounted. The first lead 11, the second lead 12, and the third lead 13 are formed integrally with the resin molding 31 in a state of being isolated from one another. In other words, the first, second, and third leads 11, 12, and 13 have isolation regions in which they are isolated from one another embedded in the resin molding, and these isolation regions are integrally supported by the resin molding 31 as electrical insulation regions.

The leads provided to the light emitting device 100 are members for mounting the light emitting elements, and also function as external connection terminals for the light emitting device and as electrodes that are electrically connected to the light emitting elements. Accordingly, the light emitting device 100 is such that part of the lower surfaces of the first lead 11 and the second lead 12 are exposed from the lower surface of the resin molding 31, constituting the external connection terminals of the light emitting device 100. Furthermore, with the light emitting device 100, part of the lower surface of the third lead 13 is exposed at the lower surface of the resin molding 31. Thus, the region directly below the light emitting elements mounted on the third lead 13 functions as a heat dissipation part that is exposed from the lower surface of the resin molding 31, which improves the heat dissipation of the light emitting device.

The first lead 11 and the second lead 12 are each disposed near a corner of the resin molding 31 in top view. Here, saying that a lead is disposed near a corner refers to the lead that is disposed closest to a corner of the resin molding 31 in top view, out of the plurality of leads provided to the light emitting device 100. The resin molding 31, which is substantially rectangular in top view, has four corners in top view. These corners are formed by two adjacent side surfaces, out of the four side surfaces of the resin molding. That is, each corner can be constituted by two side surfaces that share a corner.

With the light emitting device 100 shown in FIG. 4A, the four leads disposed near the four corners are separate leads, as is clear from FIG. 2. The first lead 11 is disposed near a first corner 41 of the resin molding 31 in top view. The first lead 11 includes the first exposed part 51 that is exposed from one of the two side surfaces that share the first corner 41, and is embedded in the resin molding 31, without being exposed from the resin molding 31 at the other side surface. The second lead 12 is disposed near a second corner 42 of the resin molding 31 in top view. The second lead 12 includes the second exposed part 52 that is exposed from one of the two side surfaces that share the second corner 42, and is embedded in the resin molding 31, without being exposed from the resin molding 31 at the other side surface.

As shown in FIGS. 1 and 2, the leads provided to each individual unit region 101 are linked to suspension pins 15 that defines substantially rectangular frames each surrounding individual unit region 101 and that link the unit regions 101 together in the state of the linked lead frame 10. The light emitting device 100 includes six leads in one unit region constituting a light emitting device 100, and these six leads have extensions 14 on the side surfaces of the leads. The extensions 14 are linked to the suspension pins 15 to constitute a lead frame 10. The lead frames 10 thus configured are put in a mold, and a resin material for forming the resin molding is injected into the mold and cured, which integrally molds the lead frames 10 and resin moldings 30. The resin moldings 30 are separated at each unit region 101 by cutting at the suspension pins that link the unit regions together. At this point, the extensions that are linked to the suspension pins are also cut along with the suspension pins. The cut surfaces of the extensions linked to the suspension pins are exposed as exposed parts at the side surfaces of the diced resin moldings. The exposed parts that are exposed form the resin molding side surfaces constitute the outer surfaces of the light emitting devices along with the cut surfaces of the resin moldings. With a light emitting device such as this, since the cut surfaces of the leads do not stick out from the side surfaces of the resin molding, the light emitting device itself can be more compact, and it is less likely that the light emitting device will be damaged in the course of being manufactured.

With the light emitting device in which a plurality of light emitting elements are individually driven as with the light emitting device of this embodiment, a single unit region includes more leads. When more leads are embedded in the resin molding, the resin molding portion of the light emitting device is reinforced by the leads, so there is an increase in the mechanical strength of the light emitting device. The more leads (exposed parts) exposed from the side surfaces of the resin molding, the higher is the risk that cracking or splitting will occur at the side surfaces (cut surfaces) of the resin molding during dicing.

To solve this problem, with the light emitting device 100, the first lead 11 disposed near the first corner 41 has an exposed part at one of the two side surfaces that share the first corner 41, but is not exposed from the other side surface. Similarly, the second lead 12 disposed near the second corner 42 has an exposed part at one of the two side surfaces that share the second corner 42, but is not exposed from the other side surface. In other words, the first lead 11 and the second lead 12 are linked by a single extension 14 to a suspension pin, and the cut surfaces of the extensions had by the first lead and second lead are exposed near the corners of the resin molding side surfaces as a first exposed part and a second exposed part. With this configuration, there is less load exerted at the corners during the cutting of the suspension pins, there is less cracking, splitting, and separation of the resin molding 31, and a more reliable light emitting device can be obtained.

More specifically, the resin molding 31, which is rectangular in top view, is diced in the X and Y directions (See, FIG. 2). Since the corners are points at which these two directions intersect, the load when the resin molding is subjected to dicing is greatest at the corners. In particular, when the extensions that extend from the same lead are disposed so as to flank the corners at positions near the corners, the load exerted on the lead during dicing at one side surface will be transmitted to the extension on the other side surface flanking the corner, and as a result, it is possible that the stress will be high enough to peel away the resin at the corner of the resin molding. In particular, the smaller is the light emitting device, the closer is the corner to the position of the extension linked to the suspension pin, so the greater is the load to which the resin at the corner is subjected. With the light emitting device of this embodiment, even with a smaller light emitting device, it is possible to reduce cracking, splitting, and separation of the resin molding.

With the light emitting device 100 shown in FIGS. 1 to 3, it is preferable if dicing is first performed in the Y direction, and then dicing is performed in the X direction. Usually, after cutting in one direction, the strength at which the resin molding is fixed is diminished, so it is conceivable that the resin molding will end up moving during cutting in the second direction, and too much load will be exerted. When the linked part near the corner is unstable state, cracking or splitting on the resin molding is prone to be occurred by excessive load on the resin molding. Therefore, it is preferable that the linked part near the corner is cut first.

As shown in FIGS. 2 and 4A, the third lead 13 on which the first light emitting element 21 and the second light emitting element 22 are mounted is disposed so as to traverse longitudinally the resin molding 31 in the approximate center of the resin molding 31 in top view. The first light emitting element 21 and second light emitting element 22 are disposed in a single row in one direction on the third lead. With the light emitting device 100, three light emitting elements, including the third light emitting element, are disposed in a row on the third lead.

Furthermore, the third lead 13 includes third exposed parts 53 that are exposed from the opposing side surfaces in the direction in which the first light emitting element 21 and second light emitting element 22 are arranged, of the side surfaces of the resin molding 31. The third exposed parts 53 are formed during dicing by cutting the extension linking the third lead to the suspension pin. The third lead is a lead on which a plurality of light emitting elements are mounted in a row, and is disposed in the approximate center of the resin molding in top view. Therefore, the third exposed parts are formed in the approximate center of the resin molding side surfaces having the third exposed part.

With the light emitting device 100, the third exposed parts 53 are exposed from the opposing side surfaces in the direction in which the plurality of light emitting elements are arranged. In other words, the third lead is disposed passing through the resin molding 31 so as to traverse longitudinally the resin molding 31 between opposing side surfaces in the direction in which the light emitting elements are arranged. Consequently, the mechanical strength of the light emitting device itself can be increased.

The third exposed parts are similar to the first and second exposed parts in that they form the outer surfaces of the light emitting device 100. Just as with the first and second exposed parts, the cut surface of the leads does not stick out from the side surfaces of the resin molding, so the light emitting device can be smaller, and at the same time there will be less damage to the light emitting device during the manufacturing process.

With the light emitting device 100, the first exposed part 51 and the second exposed part 52 are disposed on a different side surface from the side surface having the third exposed parts 53. This arrangement omits the suspension pin between third leads between adjacent unit regions 101 in the linked lead frames 10, allowing the distance to be reduced between adjacent unit regions 101, and boosting their yield per lead frame.

With a light emitting device in which a first light emitting element and a second light emitting element having a pair of positive and negative electrodes are driven individually, as with the light emitting device 100, two each (a positive and negative pair) of the first leads 11 and second leads 12 that are electrically connected to the first light emitting element 21 and the second light emitting element 22 may be provided. Also, one pair of the two first leads that are electrically connected to the first light emitting element 21 can be integrated with the third lead.

As shown in FIGS. 4A and 4B, with the light emitting device 100, the third lead 13 is generally formed in an inverted L shape in top view, and has a portion disposed at a right angle in top view to the direction in which the light emitting elements are arranged. The lower surface of this portion is exposed from the resin molding to drive the first light emitting element 21, so it can function as an external connection terminal for the light emitting device. Furthermore, the third lead 13 includes a plurality of lower surface exposed parts 55 that are exposed from the lower surface of the resin molding 31. As shown in FIG. 5, with the light emitting device 100, the third lead includes two lower surface exposed parts 55. The two lower surface exposed parts 55 are exposed from the lower surface of the resin molding, isolated from each other, as external connection terminals for driving the first light emitting element, and a heat dissipation part in which the region directly under the light emitting elements mounted on the third lead is exposed from the lower surface of the resin molding 31.

When the third lead disposed so as to go through the resin molding is integrated with the first lead and has a large upper surface area, then a plurality of lower surface exposed parts that are exposed from the lower surface of the resin molding are provided, that is, the exposed parts are isolated from one another, which means that the flow of resin material injected into the mold during resin molding will be smoother than when there is just one continuous exposed part, and the resin will readily flow into every hole and corner of the mold. Therefore, there will be fewer molding defects in the resin molding during the manufacturing process. Furthermore, since there is a larger surface area over which the leads and the resin molding are in contact, the fixing strength between the leads and the resin molding can be increased. From this same standpoint, the lower surface exposed parts (heat dissipation parts) directly under the light emitting device may be further separated and isolated.

With the light emitting device 100, the first light emitting element 21 includes an upper-and-lower electrode type of light emitting element. The first lead 11 is connected by wire to the upper electrode of the first light emitting element 21, but the lower electrode of the first light emitting element can be electrically connected to the third lead 13 by using a conductive paste as the bonding member. When the first light emitting element is thus an upper-and-lower electrode type of light emitting element, it is preferable when the third lead is in the form of an inverted L as discussed above, in order to facilitate electrical connection with the lower electrode of the first light emitting element. Although an inverted L shape is shown in the drawings, the same effect will be obtained with a regular L shape.

When the first light emitting element has a pair of positive and negative electrodes on the same side (the upper surface), the first light emitting element and the first lead are connected by wire. In this case, two first leads that are isolated from the third lead may be provided, or a first lead that is integrated with the third lead and a first lead that is separate from the third lead may each be provided. The first lead that is integrated with the third lead will be easier to form when the third lead is L-shaped or has an inverted L shape as discussed above.

When the third lead is generally L-shaped or generally has an inverted L shape in top view, the third lead can further includes a fourth exposed part 54 that is exposed from a different side surface from the side surfaces having the third exposed parts. In this case, the third lead is linked to the suspension pins by three extensions in the state of the linked lead frame. Since a third lead having a large top surface area is fixed by linking to the suspension pins in three directions, the positional precision of the third lead 13 can be increased when the resin molding 30 is formed integrally with the linked lead frame 10, and mass production is enhanced. Furthermore, when the positional precision of the third lead improves, the positional precision of the light emitting elements also improves in the mounting of the light emitting elements to the third lead, that is, the light distribution of the light emitting device can be stabilized. The extensions that extend from the third lead here are disposed so as to flank the corners, but with the light emitting device 100, load on the corners can be kept to a minimum because the third exposed part is disposed in the approximate center of the resin molding side surface having the third exposed part.

The light emitting device 100 of the embodiment includes a first light emitting element, a second light emitting element, and a third light emitting element that are disposed in the recess, and six leads for individually driving the first light emitting element, second light emitting element, and the third light emitting element. The six leads are fixed with a resin molding integrally. The resin molding 30 has a substantially cuboid shape, and the size of the resin molding is, for example, horizontal 1.9 mm by vertical 1.9 mm and 0.6 mm of the height, or horizontal 3.0 mm by vertical 3.0 mm and 0.75 mm of the height. Such light emitting device having a plurality of leads is applied relatively larger stress near the exposed part of leads of the resin molding during dicing with decreasing outer size of the resin molding. Thus, the constituents of the light emitting device exerts an effect along with decreasing outer size of the resin molding The light emitting device 100 of the embodiment includes further a recess which is for housing the first light emitting element, a second light emitting element, and a third light emitting element. The size of the recess is, for example, horizontal 1.5 mm by vertical 1.5 mm and 4 mm of the depth, or horizontal 2.5 mm by vertical 2.5 mm and 0.45 mm of the height. The wall thickness of the recess is preferably about 0.15 to 0.3 mm in light of the compact light emitting device, the cracking in the resin molding during dicing, etc.

Wires

The light emitting device 100 pertaining to Embodiment 1 includes wires for connecting the light emitting elements and the leads. The pair of electrodes formed on a light emitting element is electrically connected to leads by wires in order to supply power to the light emitting element. There are no particular restrictions on the wire material, diameter, and so on, and any wire that is normally used in this field can be used. It is particularly favorable for the wire to have good ohmic contact with the electrodes of a light emitting element, or to have good mechanical contact, or to have good electrical conductivity and thermal conductivity.

The wire, for example, can be made of gold, silver, copper, platinum, aluminum, or another such metal or any alloy of these, and the wire surface can be covered with silver or a silver alloy. Of these, silver copper, lead, aluminum, platinum, or an alloy of these is preferable when selecting a material with high reflectivity, and silver or a silver alloy is especially good. There are no particular restrictions on the diameter of the wire, but about 10 to about 70 µm is preferred, about 15 to about 50 µm is more preferred, about 18 to about 30 µm is still more preferred.

Sealing Resin

With the light emitting device 100, the resin molding 31 has a recess in which the light emitting elements are disposed, and the recess is filled with a sealing resin 61. The sealing resin 61 seals the light emitting elements, wires, and part of the leads, and protects against debris, smoke, moisture, external forces, and so forth. The material of the sealing resin 61 is preferably one that is electrically insulating and that can transmit the light emitted from the light emitting elements (preferably having a transmissivity of at least 70%). Specific examples include an epoxy resin, a silicone resin, a modified silicone resin, a phenol resin, a polycarbonate resin, an acrylic resin, a TPX resin, a polynorbornene resin and a hybrid resin which has at least one of these resins. An epoxy resin or a silicone resin is preferable.

The sealing resin may contain a light diffusing agent or a phosphor. The light diffusing agent is used to diffuse light, and moderates the directionality of the light emitting elements and increases the viewing angle. The phosphor is used to convert the wavelength of light emitted from the light emitting elements.

The light diffusing agent may be any material that is known in this field. Examples include silica, titanium oxide, zirconium oxide, magnesium oxide, magnesium carbonate, magnesium hydroxide, calcium carbonate, calcium hydroxide, calcium silicate, zinc oxide, barium titanate, aluminum oxide, iron oxide, chromium oxide, manganese oxide, glass and carbon black.

The phosphor may be any material that is known in this field. Examples include yttrium-aluminum-garnet (YAG)-based phosphors activated by cerium, lutetium-aluminum-garnet (LAG)-based phosphors activated by cerium, nitrogen-containing calcium aluminosilicate (CaO—Al2O3—SiO2)-based phosphors activated by europium and/or chromium, silicate ((Sr, Ba)2SiO4)-based phosphors activated by europium, β-sialon phosphors, nitride-based phosphors such as CASN-based or SCASN-based phosphors, KSF-based phosphors (K2SiF6:Mn) and sulfide-based phosphors.

They are usable either singularly or in the form of a mixture of two or more.

Manufacturing Method

The light emitting device of the present embodiment can be manufactured by the following method.

(i) A step of preparing a lead frame in which a plurality of unit regions each including a first lead, a second lead, and a third lead are linked by suspension pins that link the unit regions together, and a resin molding that is molded integrally with the lead frame.

The lead frame prepared in (i) and the resin molding formed integrally with the lead frame are disposed so that the first lead and second lead included in each individual unit region will be disposed near the corners of the diced resin molding in top view. Furthermore, the first lead and second lead are linked to suspension pins at a single extension.

(ii) A step of mounting a first light emitting element and a second light emitting element on a upper surface of the third lead.

(iii) A step of connecting the first light emitting element and the first lead with a wire, and the second light emitting element and the second lead with a wire.

(iv) A step of dicing the resin molding into the unit regions.

These manufacturing processes reduces cracking and splitting of the resin molding during dicing, and allows a more reliable light emitting device to be obtained.

Embodiment 2

Light Emitting Device 200

As shown in FIGS. 6 to 10, a light emitting device 200 is such that a first exposed part and a second exposed part are disposed on the same side surface as the one having the third exposed part, out of the side surfaces of the resin molding. Also, the light emitting device 200 includes two third exposed parts, and one of the third exposed parts is disposed near a corner, rather than in the approximate center of the resin molding side surface.

The light emitting device 200 differs from the light emitting device 100 in that there are fewer extensions linked to the suspension pins than in the light emitting device 100, and there is no fourth exposed part. Furthermore, with the light emitting device 200, one of third exposed part is disposed near a corner of the resin molding side surfaces. That is, a third lead has extensions on both sides of an inverted L shape in top view. This arrangement of the extensions maintains the positional precision of the third lead generally formed in an inverted L shape.

Also, with the light emitting device 200, which includes the individual unit regions of the lead frame 10, reducing the number of extension results in smoother flow of the resin material injected into the mold during resin molding, the resin more readily flows into the nooks and crannies of the mold, and there is a further reduction in molding defects of the resin molding during the manufacturing process.

The light emitting device of the present invention can be used for light sources of lighting; backlight light sources of liquid crystal displays, mobile phone, and the like; various kinds of lighting fixtures such as signals, and various kinds of display devices such as large displays, advertisements and destination guides, and car light sources; various kinds of sensors, indicators.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A lead frame for a light emitting device comprising:
a plurality of unit regions each including a first lead, a second lead and a third lead; and
a plurality of suspension pins defining substantially rectangular frames each surrounding a corresponding one of the unit regions, the suspension pins linking adjacent ones of the unit regions, wherein
in each of the unit regions,
the first lead is disposed near a first corner of a corresponding one of the substantially rectangular frames and linked to the corresponding one of the substantially rectangular frames only via a first extension,
the second lead is disposed near a second corner of the corresponding one of the substantially rectangular frames and linked to the corresponding one of the substantially rectangular frames only via a second extension, and
the third lead includes at least two third extensions respectively linked to opposing sides of the corresponding one of the substantially rectangular frames.

2. The lead frame according to claim 1, wherein
each of a width of the first extension and a width of the second extension is narrower than a width of each of the suspension pins.

3. The lead frame according to claim 1, wherein
the first extension and the second extension are respectively linked to different sides of the corresponding one of the substantially rectangular frames.

4. The lead frame according to claim 1, wherein
the first extension and the second extension are linked to the same side of the corresponding one of the substantially rectangular frames.

5. The lead frame according to claim 1, wherein
each of a width of the first extension and a width of the second extension is narrower than each of a width of the first lead and a width of the second lead.

6. A lead frame member comprising:
the lead frame according to claim 1; and
a resin molding formed integrally with the lead frame, wherein
each of the first lead, the second lead and the third lead includes an upper exposed part that is exposed from an upper surface of the resin molding and a lower exposed part that is exposed from a lower surface of the resin molding.

7. The lead frame member according to claim 6, wherein each of a width of the first extension and a width of the second extension is narrower than a width of each of the suspension pins.

8. The lead frame member according to claim 6, wherein the first extension and the second extension are respectively linked to different sides of the corresponding one of the substantially rectangular frames.

9. The lead frame member according to claim 6, wherein the first extension and the second extension are linked to the same side of the corresponding one of the substantially rectangular frames.

10. The lead frame member according to claim 6, wherein the suspension pins are embedded in the resin molding.

11. The lead frame member according to claim 6, wherein each of a width of the first extension and a width of the second extension is narrower than each of a width of the first lead and a width of the second lead.

12. The lead frame member according to claim 6, wherein the lower exposed part of the first lead has substantially the same shape as the lower exposed part of the second lead.

13. The lead frame member according to claim 6, wherein an exposed area of the upper exposed part of the third lead is greater than an exposed area of the upper exposed part of the first lead or an exposed area of the upper exposed part of the second lead.

14. The lead frame member according to claim 6, wherein an exposed area of the lower exposed part of the third lead is greater than an exposed area of the lower exposed part of the first lead or an exposed area of the lower exposed part of the second lead.

15. The lead frame member according to claim 6, wherein the third lead includes an additional lower exposed part that is exposed from the lower surface of the resin molding.

16. The lead frame member according to claim 6, wherein
the upper surface of the resin molding defines a plurality of recesses respectively corresponding to the unit regions, and
the upper exposed part of the first lead, the upper exposed part of the second lead and the upper exposed part of the third lead are exposed at a bottom face of a corresponding one of the recesses.

\* \* \* \* \*